May 30, 1972 W. S. DE FOREST ET AL 3,666,639

METHOD FOR COATING METALS OR INSULATING SUBSTRATES HAVING A VITREOUS BINDER

Filed Oct. 30, 1969 2 Sheets-Sheet 1

3,666,639

METHOD FOR COATING METALS OR INSULATING SUBSTRATES HAVING A VITREOUS BINDER

William S. De Forest, Seal Beach, Richard T. Heap, Stanton, Joseph C. Widmont, Newport Beach, and Harold Zagorin, Orange, Calif., assignors to North American Rockwell Corporation Filed Oct. 30, 1969, Ser. No. 872,622
Int. Cl. C23f *17/00;* C23b *5/64*
U.S. Cl. 204—38 C 1 Claim

ABSTRACT OF THE DISCLOSURE

A plated thick film composite and method of making of same comprising the plating of thick film conductors by electrodeposition of copper, nickel, rhodium, or other metals or combinations thereof, in an acid sulfate plating solution containing at least one of said metals onto electrically conductive metal fired ceramic containing borosilicate base binders. The invention herein described was made in the course of or under a contract or subcontract thereunder, with Air Force.

BACKGROUND OF THE INVENTION

The present invention relates to the field of thick film circuitry and more particularly plating of metals on thick film printed circuit conductors.

The electrical conductivity of presently available thick conductor materials is adequate for most applications but may prove too low for many circuit applications. In the prior art, one of the severely limiting factors in thick film printed circuit applications is the relatively low electrical conductivity afforded by fired and tinned thick film conductors. To obtain sufficient electrical conductivity, it is frequently necessary to undesirably increase the width of the conductors and size of the printed circuit board.

In addition, adhesion of the thick film to the substrate of alumina ($Al_2O_3/SiO_2$), for example, is less than satisfactory in that only minimum soldering is tolerable and rework, for example, causes separation of thick film from the substrate because of penetration of solder (tin) through the thick film to the substrate. Accordingly, any additional soldering for rework of a circuit pattern involves the probability that the entire circuit board will become unuseable. For many circuit applications, therefore, a need exists in the art for an adequate method of providing improved electrical conductivity and solderability of thick film conductor materials.

SUMMARY OF THE INVENTION

In accordance with a preferred embodiment of the present invention, a thick film printed circuit is provided on a ceramic substrate in which adequate adhesion to the substrate is assured. Thick film circuitry of the type referred to herein is described in the paper entitled "Adhesion of Platinum-Gold Glaze Conductors," by L. C. Hoffman, V. L. Bacchetta and K. W. Frederick, Proceedings of the Industrial Components Conferences in Washington D.C., May 1965, and in the article entitled "Silver Palladium Fired Electrodes" by L. F. Miller, IEE Electronics Components Proceeding, May 1968. The thick film printed circuit is readily plated with copper, nickel, rhodium, or a combination thereof. Printed circuit conductors which are treated in the manner described hereinafter exhibit improved electrical conductivity and provide for solder reworkability in that the plating is resistant to solder dissolution. In general, the plated soldered circuit pattern can be reworked while the need for touch-up of solder joint defects is significantly reduced, as a result of the inherently superior solder wetting of clean copper surfaces, and solder depletion resistance of conductors is drastically improved.

Objects and features of the invention will become apparent to those skilled in the art as the disclosure is made in the following detailed description of a preferred embodiment of the invention as illustrated in the accompanying sheets of drawings in which:

DESCRIPTION OF THE PREFERRED EMBODIMENT OF THE INVENTION

Only a very thin layer of the highly conductive metals such as copper are required to drastically increase the overall electrical conductivity of a thick film circuit. Further, the copper plating material acts to retard thick film conductor dissolution and permeating therethrough to the substrate by the tin in solder during the soldering process. As a result, the substrate is maintained along with the facility for solder reworkability. Consequently, the number of solder rework cycles can generally be greater while the need for touch-up of solder joint defects is significantly reduced.

Figure 1:
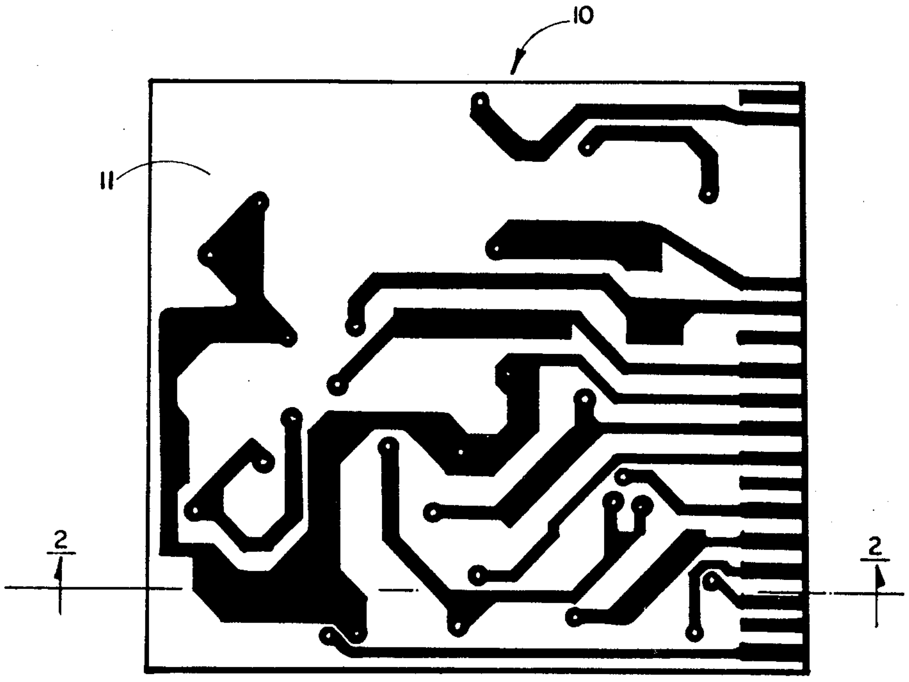
FIG. 1 is a plan view of the plated thick film conductor circuit board for illustrating the present invention.
Figure 2:
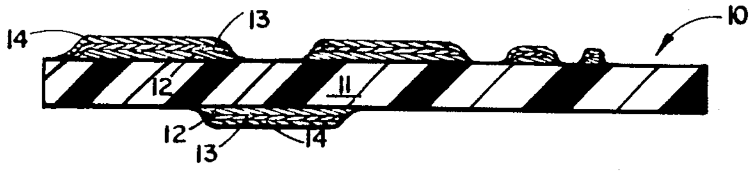
FIG. 2 is a cross-section of the circuit board of FIG. 1 showing the plated thick film conductor on both sides of the circuit board.

Referring now to the drawings, a plated thick film conductor circuit board 10 is shown in FIG. 1 to comprise an alumina substrate 11 having a thick film conductor 12 deposited on the substrate as shown by the cross-section in FIG. 2. An electrically conductive metal 13 is plated on the thick film conductor 12 and the plating 13 is covered by solder 14.

The process steps involved in the present invention are set forth as follows:

BASIC PROCESS STEPS

Unplated circuits:
(1) Prepare screen stencil image
(2) Clean substrate 11
(3) Apply conductor ink to substrate 11
(4) Tin thick film (unplated) conductor 12

Plated circuits:
(1) Same
(2) Same
(3) Same
(4) Clean substrate 11 and thick film conductor 12 of step (3)
(5) Mask exposed resistor areas
(6) Plate thick film conductor 12
(7) Rinse, dry plated conductor 13
(8) Tin plated conductor 13

Plating steps 4–7 of the process for plated circuits constitute the basic difference in prior unplated processes and the present plating process. Step 1 is the same for plated and unplated circuits and consists of preparing the screen stencil image using conventional techniques, for example, a 200 mesh type 304 stainless steel with dichromatic-sensitized gelatin stencil image. Step 2 consists of cleaning the substrate 11 by firing at elevated temperatures of from 1700–2000 F. The substrate material should be suitable for adherence of glass flux in the conductor ink, for example, an alumina substrate of 96 percent $Al_2O_3$ with 4 percent $SiO_2$. Step 3 consists of application of the conductor ink to the screen and by means of a squeege forcing the conductor ink through the screen in the open areas of the gelatin image onto the substrate 11. The substrate 11 is then removed from the screen area and fired in a suitable atmosphere at a temperature and time sufficient to drive off the organic vehicle and to cause the glass flux to melt and flow. The glass flux will cover the metallic constituents of the conductor and fuse with the substrate 11 for adhesion. An example of a suitable conductor ink is a mixture of the following:

Metallic constituents (4) parts—Gold, platinum, palladium, silver

Flux or binder (1 part)—Borosilicate glasses and/or lead borosilicate glasses

Organic vehicle (2 parts)—Ethyl cellulose, cellulose nitrate, methyl methacrylate (in suitable solvents)

The Step 4 of the prior art process is the final step for unplated circuits which provides for tinning (soldering) directly on the thick film conductor 12 of the circuit pattern. The process of the present invention provides additional Steps 4 to 7 of the metal plating process as follows:

Step 4 of the plated circuit process consists of cleaning the substrate 11 by washing with trichloroethylene at room temperatures and forced drying. Step 5 consists of masking exposed resistor areas if applicable. Step 6 consists of the electroplating of the thick film conductor 12 and utilizes the following typical parameters:

Composition: $CuSO_4.5H_2$—0.8 M (moles) per liter, $H_2SO_4$—1.2 normal

Current density: 200 amps per square foot or 1.4 amps per square inch

Anode-to-cathode spacing: 0.75 to 1.00 inch or 0.8 to 1.0 cm.

Anode area: Equal to or greater than the substrate area

Agitation: Vigorous air (0.2 to 0.4 ft.$^3$ per gallon) or mechanical solution agitation Plating time: A thickness of 0.3 to 0.5 mil will be deposited in 3.5 minutes on adherant conductors having a starting resistivity of 100 milliohms per square with all current paths from the cathode 40 ohms or less.

The required current density is substantially greater than that normally used for copper sulfate solutions. It is necessary, therefore, to maintain the precise anode to cathode spacing, provide an extremely high rate of solution agitation to reduce the cathode film thickness, and to locate the agitation uniformly over the cathode surface insuring a uniform deposit.

Step 7 consists of thoroughly rinsing the plated circuit board 10 by total immersing in flowing tap water for 30–60 seconds and baking at 250° F. for 20 minutes in air or vacuum or washing the board in absolute isopropyl alcohol to remove untrapped moisture. Step 8 consists of tinning the plated conductor pattern by dipping it in eutectic lead-tin solder (63% tin/37% lead) after applying a suitable solder flux. This is the equivalent step of Step 4 of the unplated procedure and completes the plating procedure.

The preferred process of the present invention employs a specific combination of conductor ink constituents and plating solution constituents. The relative acidity-alkalivity (pH) of the solution must be such that a "bite" is taken in the conductor binder materials to ensure plating adhesion to the metallic constituents of the thick film conductor 12. The attack on the binder is controlled so as to prevent gross loss of thick conductor-to-substrate adhesion. Essentually, the process of the present invention results in the original thick film conductor 12 becoming a current carrying "bond" for the plating material 13. The resulting resistance of the combination of plated metal 13 and original thick film conductor 12 approximates the product of the respective resistance divided by their sums which is characteristic of resistances in parallel.

The results of varying sulfuric acid concentration on conductor adhesion has shown that the 1.2 normal $H_2SO_4$ solution had the least effect on adhesion of all concentrations known at the present time. The effect of copper sulfate concentration on adhesive strength has been tested and a concentration of 0.8 mole was selected as optimum for plasting.

Concentrations indicated by the previous investigations (1.2 normal $H_2SO_4$—0.8 mole $CuSO_4$) were prepared and specimens pull tested. The results showed that the standard deviation was 206 p.s.i. with a negative 2 deviation adhesion value of 459 p.s.i. which indicated that the formulation reliably deposited 0.3 mil of copper without lowering the adhesion below 400 p.s.i. which for most applications is more than adequate adhesion to prevent separation thereof.

Figure 3:
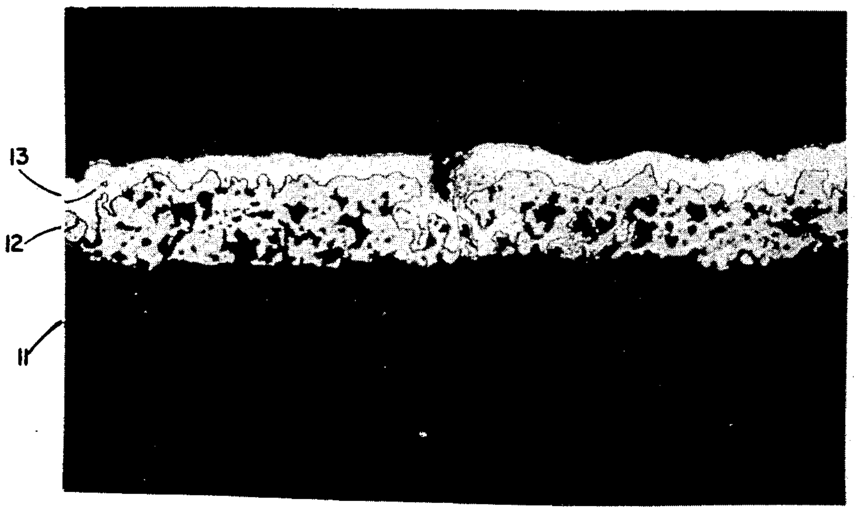
FIG. 3 is a microphotograph showing a cross-section of a typical plated thick film conductor according to the present invention.
Figure 4:
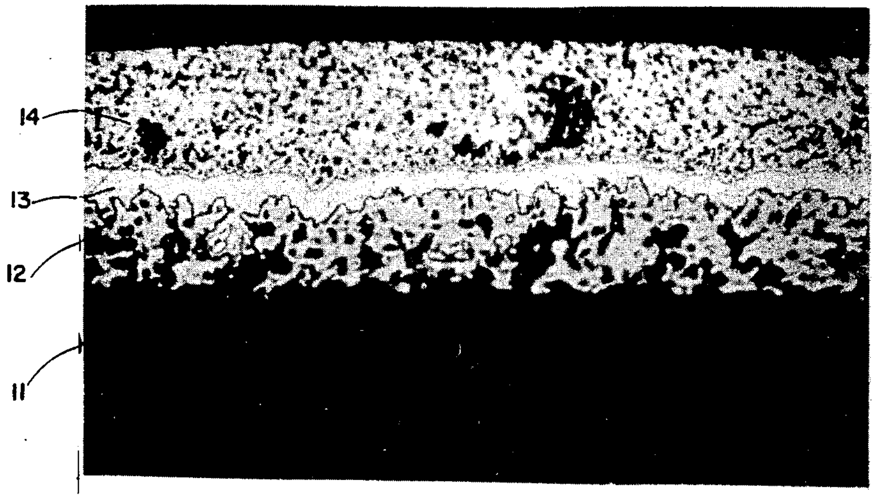
FIG. 4 is a microphotograph of a cross-section of a typical complete tinned plated thick film conductor according to the present invention.

A typical cross-section of a plated thick film conductor on the substrate 11 is shown in FIG. 3. FIG. 4 is a typical cross-section of a tinned plated thick film conductor on the substrate 11. The metal plating 13 is quite dense, uniform, and resistant to solder dissolution. Further, adhesion of the plating 13 to the thick film conductor 12 is excellent and separation failures during pull testing invariably occur between the conductor 12 and substrate 11. It should be noted that copper plating deposits, as shown in FIGS. 3 and 4, occur deep within the recesses of the thick film conductor 12 and are adherent to the metal particles of the thick film conductor 12. Etching action of sulfuric acid immediately prior to copper deposition removes the thin glass binder covering the thick film metal particles, allowing copper to be deposited directly on the newly exposed metal particles.

The copper plating 13 will resist dissolution of tin during soldering to a greater extent than will the thick film conductor 12 alone. Thus, the copper plating of the thick film circuitry will defend against said dissolution of tin to the substrate 11 during soldering with resultant loss in adhesion between the substrate 11 and the thick film circuitry 12.

In the light of the above teachings of the preferred embodiments disclosed various modifications and variations of the present invention are contemplated and will be apparent to those skilled in the art without departing from the spirit and scope of the invention.

What is claimed is:

1. In a process for electrodepositing metals upon a circuit board comprising a structure of an electrically insulating substrate, and a conductive thick film pattern including borosilicate type glass binder and metallic particles, wherein a screen stencil with an image thereon is prepared, conductive ink is applied to portions of the substrate by forcing same through the screen stencil, the substrate is removed from the screen area and fired in a suitable atmosphere at a temperature sufficient to cause the glass binder to flow and cover the metallic particles and fuse therewith and to the substrate, and wherein the thick film conductive pattern is tinned with soldering material, the improvement comprises the steps of:

washing the surfaces of the structure and drying same;

masking exposed non-conductive areas of the structure;

rinsing the structure and baking same for removal of moisture therefrom;

electrodepositing the thick film pattern by metallic plating thereof by passing an electric current of at least 200 amperes per square foot density through an electrodeposition bath containing said structure, wherein the structure acts as the cathode thereof and wherein the spacing of the anode from the cathode therein is between 0.8 and 1.0 centimeter from each other, and agitating the bath during this step for providing uniform deposition;

rinsing the structure and drying same; and eutectically bonding the plated thick film pattern with soldering material.

References Cited

UNITED STATES PATENTS

| | | | |
|---|---|---|---|
| 3,513,080 | 5/1970 | Robinson | 204—38 R |
| 3,413,777 | 12/1968 | Langly et al. | 117—123 B |
| 3,337,365 | 8/1967 | Mones | 117—123 B |
| 3,149,002 | 9/1964 | Place et al. | 117—123 B |
| 2,822,279 | 2/1958 | Larson et al. | 117—70 A |
| 2,820,727 | 1/1958 | Grattidge | 117—70 A |
| 2,819,170 | 1/1958 | Short | 117—70 A |

| | | | |
|---|---|---|---|
| 1,999,529 | 4/1935 | Smith | 204—38 B |
| 921,355 | 3/1905 | Brabrook | 204—38 B |
| 2,710,900 | 6/1955 | Linder | 204—22 |

FOREIGN PATENTS

| | | | |
|---|---|---|---|
| 18,256 | 10/1892 | Great Britain | 204—30 |
| 11,351 | 9/1885 | Great Britain | 204—30 |

JOHN H. MACK, Primary Examiner

R. L. ANDREWS, Assistant Examiner

U.S. Cl. X.R.

204—20, 30